US009465079B2

(12) United States Patent
Suzuki et al.

(10) Patent No.: US 9,465,079 B2
(45) Date of Patent: Oct. 11, 2016

(54) BATTERY PACK (71) Applicant: MAKITA CORPORATION, Anjo-shi, Aichi (JP)

(72) Inventors: Hitoshi Suzuki, Anjo (JP); Masaaki Fukumoto, Anjo (JP); Hidenori Nagasaka, Anjo (JP)

(73) Assignee: MAKITA CORPORATION, Anjo-Shi (JP)

( * ) Notice: Subject to any disclaimer, the term of this patent is extended or adjusted under 35 U.S.C. 154(b) by 203 days.

(21) Appl. No.: 14/310,939

(22) Filed: Jun. 20, 2014

(65) Prior Publication Data

US 2014/0375231 A1    Dec. 25, 2014

(30) Foreign Application Priority Data

Jun. 25, 2013   (JP) .................................. 2013-132814

(51) Int. Cl.
| | |
|---|---|
| *H02P 1/00* | (2006.01) |
| *G01R 31/36* | (2006.01) |
| *H01M 2/10* | (2006.01) |
| *H01M 10/42* | (2006.01) |
| *H01M 10/48* | (2006.01) |
| *B60L 11/18* | (2006.01) |
| *H02J 7/00* | (2006.01) |

(52) U.S. Cl.
CPC ........ *G01R 31/3606* (2013.01); *B60L 11/1861* (2013.01); *H01M 2/1022* (2013.01); *H01M 10/4257* (2013.01); *H01M 10/48* (2013.01); *H01M 10/486* (2013.01); *H02J 7/0047* (2013.01); *H02J 2007/005* (2013.01); *H02J 2007/0049* (2013.01)

(58) Field of Classification Search
None
See application file for complete search history.

(56) References Cited

U.S. PATENT DOCUMENTS

| | | | |
|---|---|---|---|
| 4,775,827 A | 10/1988 | Ijntema et al. | |
| 5,580,675 A | 12/1996 | Rouhani | |
| 5,825,155 A | 10/1998 | Ito et al. | |
| 6,191,554 B1 * | 2/2001 | Nakane | H02J 7/0057 320/107 |

(Continued)

FOREIGN PATENT DOCUMENTS

| | | |
|---|---|---|
| EP | 0 248 461 A1 | 12/1987 |
| JP | A-2004-95299 | 3/2004 |

OTHER PUBLICATIONS

Oct. 22, 2014 Extended European Search Report issued in European Application No. 14173753.

*Primary Examiner* — Marlon Fletcher
(74) *Attorney, Agent, or Firm* — Oliff PLC (57) ABSTRACT A battery pack includes: a battery; a notification unit configured to notify that a fully charged state is reached; a determination unit configured to determine whether the fully charged state is reached; a processing unit configured to execute a full charge process if the fully charged state is determined, the full charge process being one of causing the notification unit to make a notification and maintaining a possible state, in which making a notification is possible; and a factor detection unit configured to detect occurrence of a predetermined increase factor during execution of the full charge process, the increase factor leading to increase in a chargeable capacity of the battery as compared with the time when the fully charged state is determined. The processing unit stops the full charge process if occurrence of the increase factor is detected during execution of the full charge process.

9 Claims, 9 Drawing Sheets

(56) References Cited

U.S. PATENT DOCUMENTS

| | | | | |
|---|---|---|---|---|
| 6,229,280 B1* | 5/2001 | Sakoh | | G01R 31/3682 320/106 |
| 2002/0175654 A1* | 11/2002 | Takano | | H02J 7/0047 320/115 |
| 2006/0214627 A1* | 9/2006 | Ito | | H01M 10/42 320/107 |
| 2007/0103113 A1* | 5/2007 | Embrey | | H02J 7/0011 320/112 |
| 2010/0085008 A1* | 4/2010 | Suzuki | | B25F 5/00 320/112 |
| 2010/0327818 A1* | 12/2010 | Taniguchi | | H01M 10/441 320/162 |
| 2011/0006731 A1* | 1/2011 | Wang | | B60L 11/1816 320/109 |
| 2011/0161025 A1* | 6/2011 | Tomura | | G01R 31/3651 702/63 |
| 2012/0112700 A1* | 5/2012 | Morimoto | | H02J 7/0072 320/132 |
| 2013/0314050 A1* | 11/2013 | Matsubara | | H02J 7/00 320/134 |
| 2014/0253043 A1* | 9/2014 | Cho | | G08B 21/182 320/134 |
| 2014/0292283 A1* | 10/2014 | Timmons | | B60L 11/1809 320/152 |
| 2015/0097512 A1* | 4/2015 | Li | | B60L 11/182 320/101 |

* cited by examiner

BATTERY PACK

CROSS-REFERENCE TO RELATED APPLICATIONS

This application claims the benefit of Japanese Patent Application No, 2013-132814 filed Jun. 25, 2013 in the Japan Patent Office, and the entire disclosure of Japanese Patent Application No. 2013-132814 is incorporated herein by reference.

BACKGROUND

The present invention relates to a battery pack including a secondary battery.

As various types of motor-driven appliances, such as electric power tools or electric working machines, rechargeable motor-driven appliances are prevalent. For example, it may be configured such that a battery pack including a secondary battery is attached to an appliance main body, and thereby the appliance main body is operable by power from the battery pack.

A user of such a motor-driven appliance generally wants to work with a fully charged battery pack or an almost fully charged battery pack (with as large a remaining capacity as possible) attached so that the user can work as long as possible using the same single battery pack. Therefore, it is convenient for the user to be able to recognize a charge state of the battery pack.

Japanese Unexamined Patent Application Publication No. 2004-95299 discloses a technique in which a slidable sliding portion is provided in a side face of a battery pack. According to the technique, a user can easily determine, by means of the sliding portion, whether the battery pack is in a fully charged state or is already partially discharged.

Specifically, when the battery pack is inserted into a battery charger, the sliding portion slides and a position of the sliding portion is shifted to a "Fully Charged" position. Then, the position of the sliding portion is maintained at the "Fully Charged" position until the battery pack is inserted into a tool. When the battery pack is inserted into the tool, the sliding portion slides and the position of the sliding portion is shifted to a "Used" position. Thus, a user can easily determine a state of the battery pack depending on the position of the sliding portion.

SUMMARY

In the aforementioned technique, however, a user cannot always correctly recognize an actual state (i.e., a charge state) of the battery pack. Specifically, even when the sliding portion is at the "Fully Charged" position, the battery pack actually may not be in a fully charged state and may be further chargeable in some cases. For example, the position of the sliding portion remains at the "Fully Charged" position unless the battery pack is inserted into the tool. However, a remaining capacity of the battery pack gradually decreases while the battery pack is left for a long time. As a result, the user may misunderstand that the battery pack is in a fully charged state, although the remaining capacity of the battery pack actually has been decreasing.

Also, the position of the sliding portion is shifted to the "Fully Charged" position merely by insertion of the battery pack into the battery charger. Accordingly, for example, even in a case where the battery pack is only temporarily inserted into the battery charger and is removed from the battery charger without being substantially charged, the position of the sliding portion remains at the "Fully Charged" position. As a result, a user may misunderstand that the battery pack is in a fully charged state, although the battery pack has not been substantially charged.

Further, the position of the sliding portion is shifted to the "Used" position merely by insertion of the battery pack into the tool. Accordingly, for example, even in a case where a fully charged battery pack is inserted into the tool but is removed from the tool without being used at all, the position of the sliding portion remains at the "Used" position. As a result, a user may misunderstand that the remaining capacity of the battery pack is small, although the battery pack is actually in a fully charged state.

Some battery chargers have a function to limit a charge amount depending on a temperature of a secondary battery in a battery pack. Specifically, for example, at normal temperature, charging of the secondary battery is performed until a voltage of the secondary battery reaches a predetermined set value (a normal-temperature set value), i.e., when charging is performed up to the normal-temperature set value, the charging is stopped based on an understanding that the secondary battery is in a fully charged state; at lower temperatures, a set value of a charging voltage is set to a predetermined set value lower than the normal-temperature set value.

In a case of charging a battery pack using the aforementioned battery charger having the function to limit a charge amount depending on a temperature of the secondary battery, even if charging is performed to a fully charged state at lower temperatures, when the temperature of the secondary battery rises thereafter due to, for example, a change in ambient temperature, and enters a normal temperature range, the secondary battery becomes further chargeable (i.e., no longer in the fully charged state) at the time of entering the normal temperature range. However, since charging has been performed to the fully charged state at lower temperatures, a user may misunderstand that the battery pack remains in the fully charged state despite a temperature rise thereafter.

It is preferable for a user to properly recognize a correct charge state in accordance with an actual remaining capacity of the battery pack (for example, whether the battery pack is actually in the fully charged state or is actually not fully charged but further chargeable).

A battery pack in one aspect of the present invention includes a battery having a secondary battery, a notification unit, a determination unit, a processing unit, and a factor detection unit.

The notification unit notifies that the battery is in the fully charged state. The determination unit determines whether the battery is in the fully charged state. The processing unit executes a full charge process if it is determined by the determination unit that the battery is in the fully charged state, the full charge process being one of causing the notification unit to make a notification and maintaining a possible state, in which making a notification by the notification unit is possible. In a case where at least one predetermined increase factor occurs during execution of the full charge process, the at least one predetermined increase factor leading to increase in a chargeable capacity of the battery as compared with the time when it is determined by the determination unit that the battery is in the fully charged state, the factor detection unit detects occurrence of the at least one predetermined increase factor.

The processing unit stops the full charge process when occurrence of the at least one predetermined increase factor is detected by the factor detection unit during execution of the full charge process.

According to the battery pack configured as above, when it is determined that the battery is in the fully charged state, the full charge process is executed; if an increase factor occurs after the determination, the full charge process is stopped (for example, entering a state in which the determination of the fully charged state is cancelled and no notification is made by the notification unit). Thus, a user can properly recognize a charge state based on an actual remaining capacity, such as whether the battery is actually in the fully charged state.

In a case where the battery pack is attachable/detachable to/from a main body of a motor-driven appliance, and it is possible to perform a discharge from the battery to the main body when the battery pack is attached to the main body, occurrence of an increase factor may be detected when the discharge is performed. For example, the battery pack may include a discharge detection unit configured to directly or indirectly detect that a discharge from the battery to the main body is performed, and detection of a discharge by the discharge detection unit may be at least one of the at least one predetermined increase factor.

When a discharge from the battery to the main body is performed, the battery becomes chargeable again by at least an amount of the discharge. Accordingly, if a discharge from the battery to the main body is detected by the discharge detection unit after the battery is determined to be in the fully charged state, the full charge process may be stopped. This allows a user to properly recognize that the battery is no longer in the fully charged state due to the discharge to the main body.

There may be various methods for detecting a discharge from the battery to the main body in the battery pack. For example, the following method may be employed: in a case where the main body includes an operation switch to be operated to perform a discharge from the battery to the main body, and is configured to transmit to the battery pack, when the operation switch is operated, an operation signal indicating the fact of operation, the discharge detection unit detects that a discharge from the battery to the main body is performed when receiving the operation signal from the main body.

According to the battery pack with such configuration, the presence or absence of discharge from the battery to the main body (and thus occurrence or absence of an increase factor) can be easily detected based on the operation signal from the main body.

In a case where the battery pack includes a temperature detection unit configured to detect a temperature of the battery, at least one of the at least one predetermined increase factor may be a rise of the temperature of the battery detected by the temperature detection unit from the temperature at the time when it is determined by the determination unit that the battery is in the fully charged state.

Due to the nature of batteries, the chargeable capacity of a battery tends to be higher as the temperature of the battery is higher, and to be lower as the temperature of the battery is lower. Accordingly, in a case where charging is performed under a low temperature environment and thus the charging is completed by reaching the fully charged state with a lower charge amount than that in a normal temperature environment, and thereafter the temperature of the battery reaches a normal temperature due to an ambient temperature rise, the battery is no longer in the fully charged state and may enter a further chargeable state.

Accordingly, if the temperature of the battery rises from the temperature at the time when the battery is determined to be in the fully charged state, the full charge process is stopped by recognizing an increase factor, allowing a user to properly recognize that the battery is no longer in the fully charged state due to a temperature rise.

A timing to cause the notification unit to make a notification may be appropriately set. For example, the battery pack may include a request detection unit configured to detect a predetermined notification request to cause the notification unit to make a notification. The processing unit may execute the full charge process of maintaining the possible state, and may also cause the notification unit to make a notification if a notification request is detected by the request detection unit during the execution of the full charge process.

For example, regardless of presence/absence of a notification request, the processing unit maintains the possible state if it is determined by the determination unit that the battery is in the fully charged state. Then, if a notification request is detected while the possible state is maintained, the processing unit causes the notification unit to make a notification. With such configuration, a user can properly recognize the charge state depending on an actual remaining capacity.

For example, in a case where the battery pack includes a request detection unit, the determination unit may determine whether the battery is in the fully charged state if a notification request is detected by the request detection unit. Also, the processing unit may cause the notification unit to make a notification as the full charge process.

For example, the determination unit may make a determination when a notification request is received. Then, if the battery is determined to be in the fully charged state when the notification request is received, the notification unit may be caused to make a notification. In this case, by making a notification request, a user can properly recognize, when necessary, the charge state depending on an actual remaining capacity. In addition, it may be possible to reduce processing loads on the determination unit and the processing unit since a determination on whether the fully charged state is reached is made when a notification request is received.

The request detection unit may include a behavior detection unit configured to detect a behavior of the battery pack, and detects, if a predetermined behavior is detected by the behavior detection unit, the behavior as the notification request. In this case, a user can confirm the charge state of the battery by causing the predetermined behavior, such as moving the battery pack or attaching the battery pack to an appliance or the like as a target of the power supply, and can enjoy improved convenience.

BRIEF DESCRIPTION OF THE DRAWINGS

Preferred embodiments of the present invention will be described hereinafter with reference to the accompanying drawings, in which:

FIGS. 4A-4C are explanatory views showing internal configurations of the battery pack in the embodiments, in which FIG. 4A is a plan view, FIG. 4B is a front view, and FIG. 4C is a partial cross-sectional view;

DETAILED DESCRIPTION OF THE PREFERRED EMBODIMENTS

The present invention should not be limited to specific devices, configurations, and the like shown in the below described embodiments, but may be embodied in various forms within the scope not departing from the spirit of the present invention. For example, part of, a configuration in an embodiment below may be replaced with a publicly-known configuration having a similar function, may be added to or substituted with a configuration in another embodiment, or may be omitted. Also, a different configuration may be used by appropriately combining the following plurality of embodiments.

First Embodiment

(1) Configuration of Electric Power Tool

Figure 1:
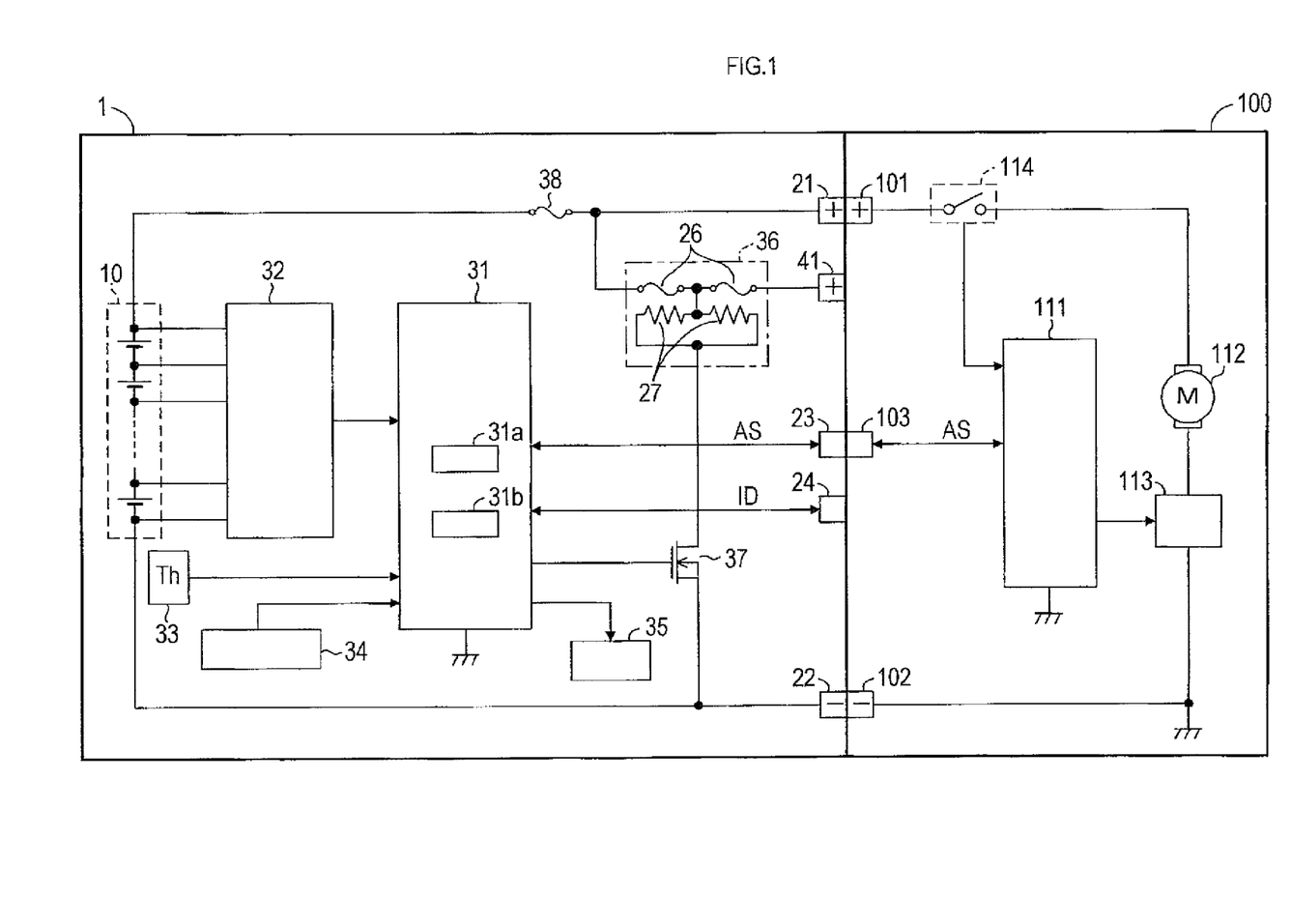
FIG. 1 is a block diagram showing a schematic configuration of an electric power tool in the embodiments.

A battery pack 1 is attachable/detachable to/from a main body (a tool main body) 100 of an electric power tool as shown in FIG. 1. When the battery pack 1 is attached to the tool main body 100, the battery pack 1 and the tool main body 100 are physically and electrically connected together. FIG. 1 shows a state where both are connected to each other.

The battery pack 1 includes a battery 10, a discharge terminal 21, an anode terminal 22, a communication terminal 23, a communication terminal 24, a charge terminal 41, a microcomputer 31, a cell state detection unit 32, a thermistor 33, an oscillation sensor 34, an LED 35, a self control protector (hereinafter, referred to as an "SCP") 36, an FET 37, and a fuse 38.

The battery 10 comprises a plurality of secondary battery cells that are serially connected together. Although the secondary battery cells in the present embodiment are lithium-ion battery cells, this is merely an example and any other type of secondary battery cells may be employed.

A cathode of the battery 10 is connected to the discharge terminal 21 through the fuse 38 and is also connected to the charge terminal 41 through the fuse 38 and the SCP 36. An anode of the battery 10 is connected to the anode terminal 22. The fuse 38 is melted down when a current above a predetermined maximum allowable current flows therethrough. As a result, a discharge path from the battery 10 to the discharge terminal 21 and a charge path from the battery 10 to the charge terminal 41 are disconnected.

When discharging from the battery 10 to outside of the battery pack 1 (for example, to the tool main body 100), power of the battery 10 is outputted through the discharge terminal 21. In contrast, when charging the battery 10, charging power from the battery charger is inputted through the charge terminal 41 as described later with reference to FIG. 2.

The SCP 36 has a general configuration including two fuses 26, 26 that are serially arranged in a conduction path between the charge terminal 41 and the fuse 38, and two heat-generating resistors 27, 27 to melt down the respective fuses 26, 26. Respective first ends of the two heat-generating resistors 27, 27 are connected to each other and then connected to a connecting portion between the two fuses 26, 26. Respective second ends of the two heat-generating resistors 27, 27 are connected to each other and then connected to a drain of the FET 37. A source of the FET 37 is connected to the anode terminal 22, and a gate of the FET 37 is connected to the microcomputer 31.

When detecting an overdischarge, an overload, or the like of the battery 10, the microcomputer 31 outputs an auto-stop signal indicating such detection to the tool main body 100 through the communication terminal 23. Also, when detecting an abnormality of various types (excluding the aforementioned overdischarge and overload) in the battery pack 1, such as an abnormality of the battery 10 or an abnormality in the microcomputer 31, the microcomputer 31 outputs an auto-stop signal indicating such detection to the tool main body 100 through the communication terminal 23, and also turns on the FET 37. When the FET 37 is turned on, current flows from the battery 10 to the two heat-generating resistors 27, 27 forming the SCP 36, and thereby the heat-generating resistors 27, 27 generate heat. As a result, the respective fuses 26, 26 are melted down, and a power supply path for charging is disconnected.

The cell state detection unit 32 obtains a voltage (a battery voltage) of the entire battery 10 as well as voltages (cell voltages) of respective secondary battery cells forming the battery 10, and outputs signals representing these voltages to the microcomputer 31.

The thermistor 33 is provided in a vicinity of the battery 10 to detect a temperature of the battery 10 (a battery temperature). The thermistor 33, which is connected to the microcomputer 31, outputs to the microcomputer 31 a detection signal depending on the battery temperature. The microcomputer 31 detects the battery temperature based on the detection signal from the thermistor 33.

The oscillation sensor 34 is a sensor to detect oscillation of the battery pack 1. When an oscillation occurs in the battery pack 1, for example, due to movement of the battery pack 1 or attachment of the battery pack 1 to the tool main body 100 by a user, the oscillation sensor 34 detects the oscillation and outputs a detection signal based on the oscillation to the microcomputer 31. The microcomputer 31 detects the presence/absence of oscillation of the battery pack 1 based on the detection signal from the oscillation sensor 34. The LED 35 is a known light emitting device, and turning on/off of the LED 35 is controlled by the microcomputer 31.

The microcomputer 31 includes a CPU 31a, a memory 31b, and other components. The microcomputer 31 executes various control programs stored in the memory 31b to thereby achieve various functions. One of the functions to be achieved by the microcomputer 31 is a notification function. The notification function is a function to detect whether the battery 10 is in a fully charged state and to control the LED 35 in accordance with a detection result. In addition, the microcomputer 31 may have a function to perform various data communication with the tool main body 100 through the communication terminal 23 or a function to perform various data communication with a battery charger 120 (see FIG. 2) through the communication terminal 24.

As shown in FIG. 1, the tool main body 100 includes a microcomputer 111, a motor 112, a drive circuit 113, a trigger switch 114, a cathode terminal 101, an anode terminal 102, and a communication terminal 103.

The cathode terminal 101 is connected to one end of the motor 112 through the trigger switch 114. The anode terminal 102 is connected to the other end of the motor 112 through the drive circuit 113. The motor 112 in the present embodiment is a direct-current motor with brush.

The trigger switch 114 is turned on/off by a user's operation of a trigger (not shown) provided in the tool main body 100. The trigger switch 114 is turned on when a user pulls a trigger, and is turned off when a user releases the trigger. Information on on/off of the trigger switch 114 is inputted to the microcomputer 111.

The microcomputer 111, which includes a not-shown CPU, a memory, and other components, achieves various functions by the CPU executing various programs stored in the memory. When the trigger switch 114 is turned on, the microcomputer 111 turns on a drive switch in the drive circuit 113 to thereby start current conduction (discharge) from the battery pack 1 to the motor 112 and thus cause the motor 112 to operate. When the motor 112 rotates, its rotary driving force causes a not-shown tool element to operate, and thereby a function as an electric power tool is achieved. When the trigger switch 114 is turned off, the microcomputer 111 turns off the drive switch in the drive circuit 113 to thereby stop discharge from the battery pack 1 to the motor 112 and thus stop the motor 112.

When the trigger switch 114 is turned on, the microcomputer 111 transmits a trigger-on signal to the battery pack 1 through the communication terminal 103. In a case where an auto-stop signal is inputted to the microcomputer 111 from the battery pack 1 through the communication terminal 103 during current conduction from the battery pack 1 to the motor 112, the microcomputer 111 forcibly stops the current conduction to the motor 112.

(2) Configuration of Charging System

Figure 2:
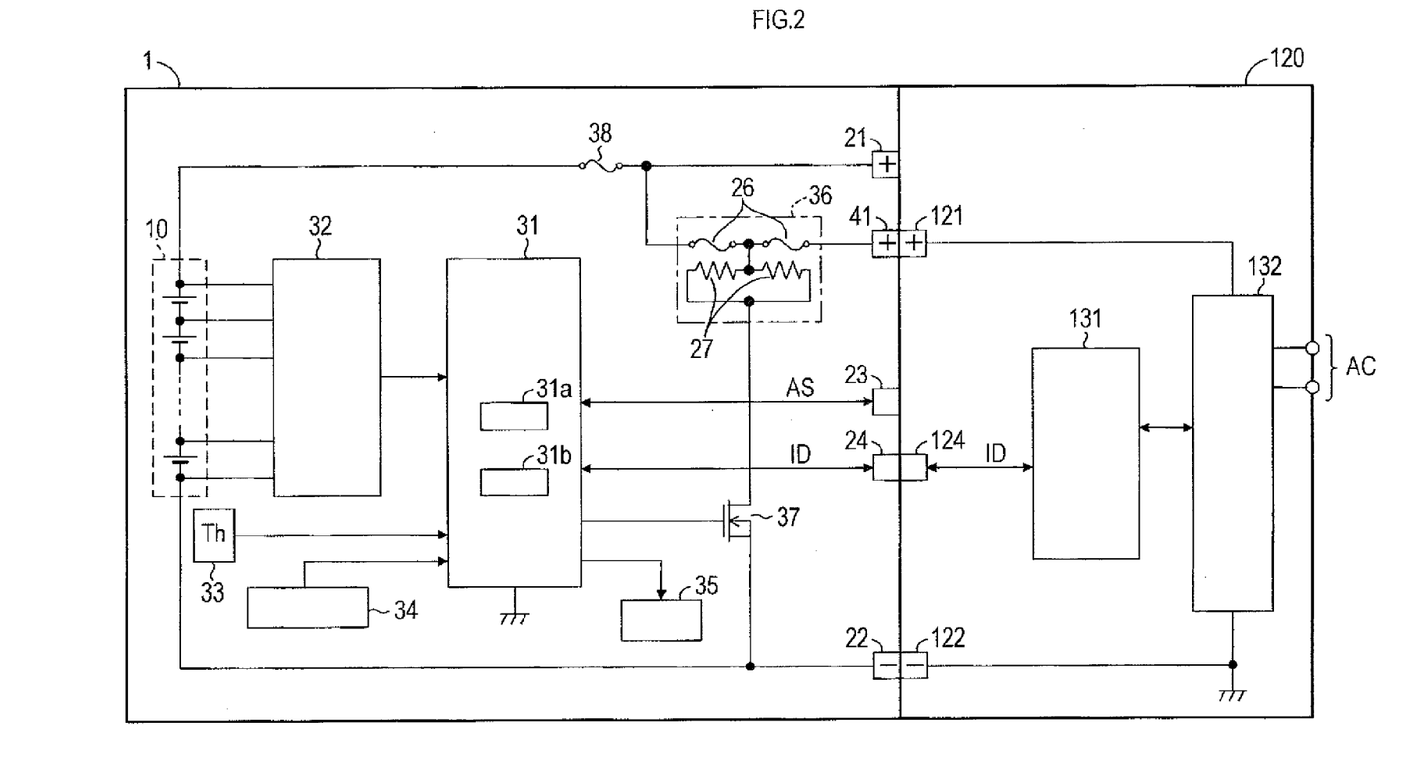
FIG. 2 is a block diagram showing a schematic configuration of a charging system in the embodiments.

A description will be given of a charging system to charge the battery pack 1 with reference to FIG. 2. The battery pack 1 is repeatedly rechargeable with the battery charger 120. When the battery pack 1 is attached to the battery charger 120, the battery pack 1 and the battery charger 120 become physically and electrically connected together. FIG. 2 shows a connected state thereof. In FIG. 2, the battery pack 1 is identical to the battery pack 1 shown in FIG. 1.

As shown in FIG. 2, the battery charger 120 includes a microcomputer 131, a power circuit 132 for charging, a cathode terminal 121, an anode terminal 122, and a communication terminal 124. The power circuit 132, which includes therein a rectifier circuit and a switching power circuit, rectifies and transforms an alternating-current voltage supplied from an alternating-current (AC) source, such as a commercial power source, to generate a direct-current voltage for charging the battery pack 1.

The microcomputer 131 includes a CPU, a memory, and other components. The microcomputer 131 can perform data communication with the microcomputer 31 in the battery pack 1 through the communication terminal 124.

When the battery pack 1 is attached to the battery charger 120, the microcomputer 131 controls the power circuit 132 to supply the direct-current voltage for charging to the battery pack 1 to thereby charge the battery pack 1 (i.e., charge the battery 10).

When the microcomputer 31 in the battery pack 1 recognizes that the battery pack 1 has been connected to the battery charger 120 by, for example, data communication through the communication terminal 24, the microcomputer 31 periodically transmits information (battery information), such as the battery voltage, and the cell voltages of the respective cells and the battery temperature, to the microcomputer 131 in the battery charger 120.

The microcomputer 131 in the battery charger 120 charges the battery 10 while monitoring the charge state of the battery 10 based on the battery information that is periodically transmitted from the microcomputer 31 in the battery pack 1. When the cell voltage of any one of the cells has reached a fully charged state, the microcomputer 131 determines that the battery 10 as a whole has reached a fully charged state, and transmits a charge-completion signal to the microcomputer 31 in the battery pack 1 to stop charging.

As described above, the battery charger 120 in the present embodiment stops charging when any one of the cells has reached a fully charged state. The battery charger 120 sets a full charge amount of the battery 10 (a full charge amount of the cell) depending on the battery temperature. For example, a full charge amount of each of the cells varies depending on whether the battery temperature is in a predetermined normal temperature range or in a low temperature range lower than the normal temperature range in the present embodiment.

Specifically, in the charging system of the present embodiment, the set value for the cell voltage is set to a set value VH (for example, 4.1V) when the battery temperature is in the normal temperature range. In this case, when the cell voltage of at least one of the cells has reached the set value VH or higher, while the battery temperature is in the normal temperature range, the cell is determined to be in the fully charged state, and thus the battery 10 as a whole is determined to be in the fully charged state.

On the other hand, when the battery temperature is in the low temperature range, the set value for the cell voltage is set to a set value VL (for example, 3.6V) lower than the set value VH. In this case, when the cell voltage of at least one of the cells has reached the set value VL or higher, while the battery temperature is in the low temperature range, the cell is determined to be in the fully charged state, and thus the battery 10 as a whole is determined to be in the fully charged state.

Figure 3:
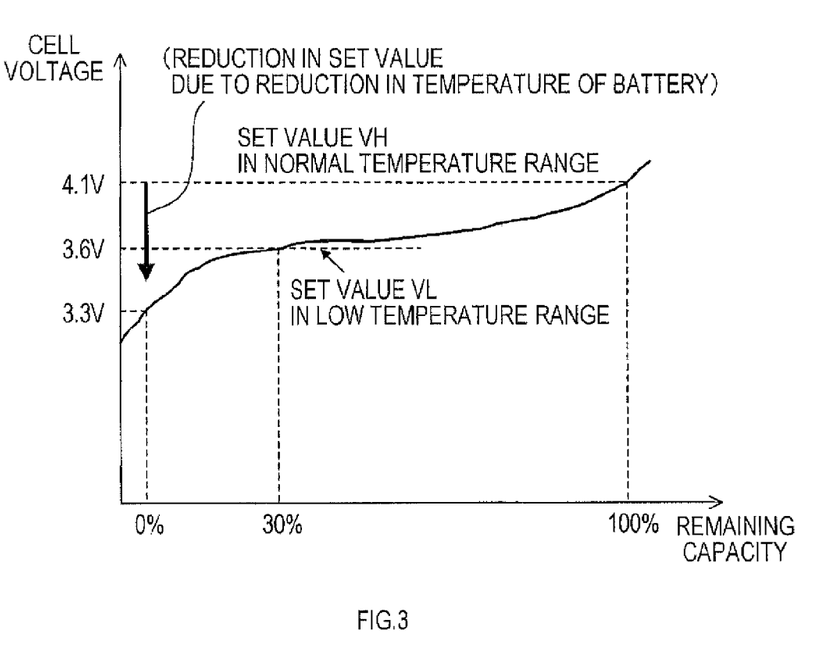
FIG. 3 is an explanatory view showing a relationship between a cell voltage and a remaining capacity.

FIG. 3 shows an example of a relationship between the cell voltage and a remaining capacity. Each of the cells can be charged to at least 4.1V. Assuming that the charge amount (the remaining capacity) is 100% when the cell voltage is 4.1V, the remaining capacity decreases as the cell voltage becomes lower from 4.1V. When the cell voltage is 3.6V, the remaining capacity is 30%.

In the present embodiment, the aforementioned set value is adjusted depending on the battery temperature. Accordingly, the set value is set to 4.1V at normal temperature; the set value is set to 3.6V at low temperature. For example, at low temperature, when the cell voltage is 3.6V or higher, the cell is determined to be in the fully charged state, and thus charging is stopped.

Therefore, in a case where charging is performed to reach the fully charged state at low temperature, the cells are indeed in the fully charged state with reference to the set value VL; however, the charge amount of the cells is approximately 30% with reference to a maximum capacity (the set value VH) chargeable at normal temperature. Consequently, in a case where charging is performed to reach the fully charged state (for example, a cell voltage of 3.6V) at low temperature and thereafter the battery temperature rises to enter the normal temperature range, the cells are no longer in the fully charged state and are in a further chargeable state (for example, chargeable to 4.1V).

The microcomputer 131 in the battery charger 120 may obtain information of the battery temperature from the microcomputer 31 in the battery pack 1 and set the set value VH or the set value VL based on the obtained information; or may directly obtain the set value VH or the set value VL corresponding to the battery temperature from the microcomputer 31 in the battery pack 1. The microcomputer 131 in the battery charger 120 sets the set value based on the microcomputer 31 in the battery pack 1, and then performs charging. Then, when at least one cell voltage reaches or exceeds the set value, the microcomputer 131 determines that the battery 10 has reached the fully charged state, transmits a charge-completion signal to the battery pack 1 to stop the charging.

In contrast to the aforementioned configuration, there may be a configuration in which the microcomputer 31 in the battery pack 1 sets the set value depending on the battery temperature; monitors the cell voltages of the cells while being charged; and transmits, when at least one cell voltage has reached or exceeded the set value, a charge-completion signal notifying of the fact to the battery charger 120, to thereby stop supply of charging power from the battery charger 120.

(3) Internal Configuration of Battery Pack 1

Figure 4A:
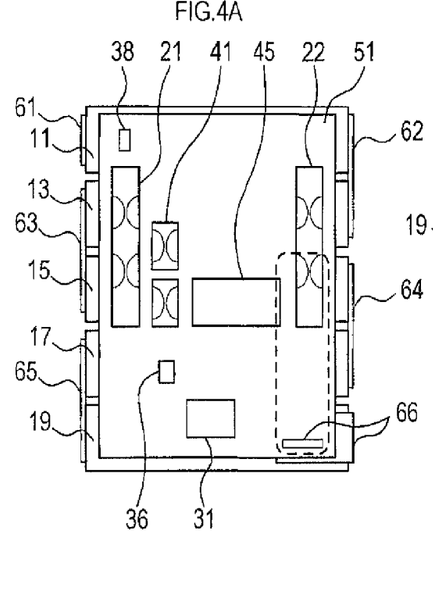
Figure 4B:
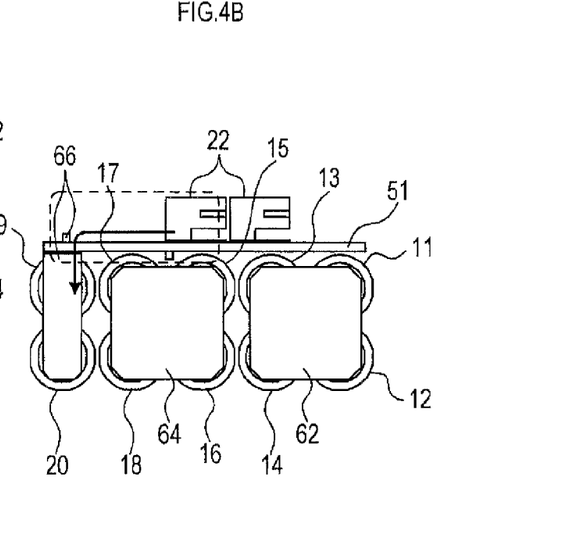
Figure 4C:
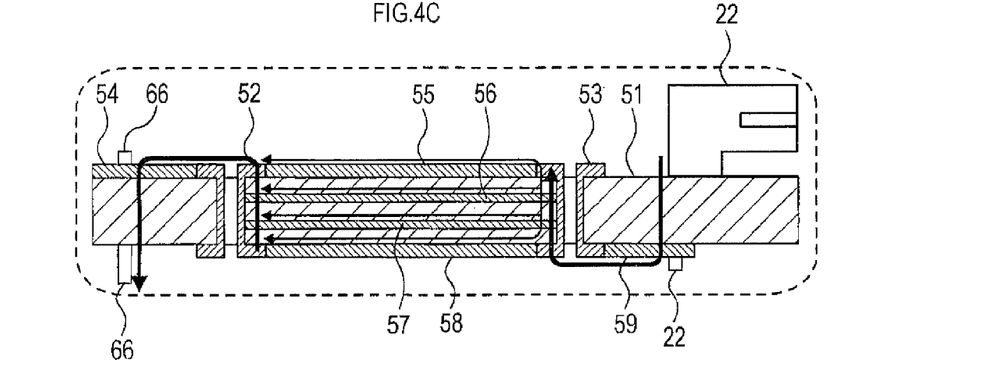

Next, an internal configuration of the battery pack 1 will be described schematically with reference to FIG. 4. As shown in FIG. 4, the battery pack 1 includes ten cells 11-20 constituting the battery 10. The ten cells 11-20 are connected together in series. Specifically, the cells have a connection configuration in which five parallel blocks, each of which is formed by two parallelly-connected cells, are connected together in series. The parallel blocks are serially connected by block connection electrodes 62, 63, 64 and 65.

Cathodes of the two cells 11, 12 on a highest potential side are connected to the discharge terminal 21 through a cathode electrode 61 and the fuse 38, and anodes of the two cells 19, 20 on a lowest potential side are connected to the anode terminal 22 through an anode electrode 66.

A substrate 51 is disposed over the ten cells 11-20. On a surface of the substrate 51 (on a side opposite to the side of the cells), the charge terminal 41, the microcomputer 31, the SCP 36, the fuse 38, a connector 45, etc., in addition to the discharge terminal 21 and the anode terminal 22 are mounted as shown in FIG. 4A. The connector 45 includes the communication terminal 23 and the communication terminal 24. The cell state detection unit 32, the thermistor 33, the oscillation sensor 34, the LED 35, and the FET 37 are not shown in FIG. 4A.

More particularly, the anode electrode 66 and the anode terminal 22 are electrically connected through a conductor pattern provided on the substrate 51 as shown in FIG. 4C. For example, the anode electrode 66 is directly connected to a top-surface conductor pattern 54 provided on the substrate 51. The top-surface conductor pattern 54 is connected to a through hole 52. The through hole 52 is connected to a through hole 53 through a multi-layer conductor pattern, and the through hole 53 is connected to a reverse-surface conductor pattern 59. The reverse-surface conductor pattern 59 is directly connected to the anode terminal 22. The multi-layer conductor pattern specifically includes four conductor layers, for example, a top-surface layer 55, a first internal layer 56, a second internal layer 57, and a reverse-surface layer 58.

Accordingly, a discharge current, for example, flows from the anode terminal 22 through the reverse-surface conductor pattern 59, the through hole 53, the multi-layer conductor pattern, the through hole 52, the top-surface conductor pattern 54, and the anode electrode 66, and into the cells 19, 20 on the lowest potential side. A charge current during charging flows in a reverse direction.

(4) Various Processes Executed by Microcomputer in Battery Pack 1

Next, a description will be given of various processes to achieve the aforementioned notification function among various processes to be executed by the microcomputer 31 in the battery pack 1. The microcomputer 31 executes respective processes shown in FIGS. 5 to 8 in order to achieve the notification function.

(4-1) Full Charge Determination Process

First, a description of a full charge determination process will be given with reference to FIG. 5. When starting operation, the CPU 31a of the microcomputer 31 in the battery pack 1 reads a program for the full charge determination process in FIG. 5 from the memory 31b, and then periodically and repeatedly executes the program.

Figure 5:
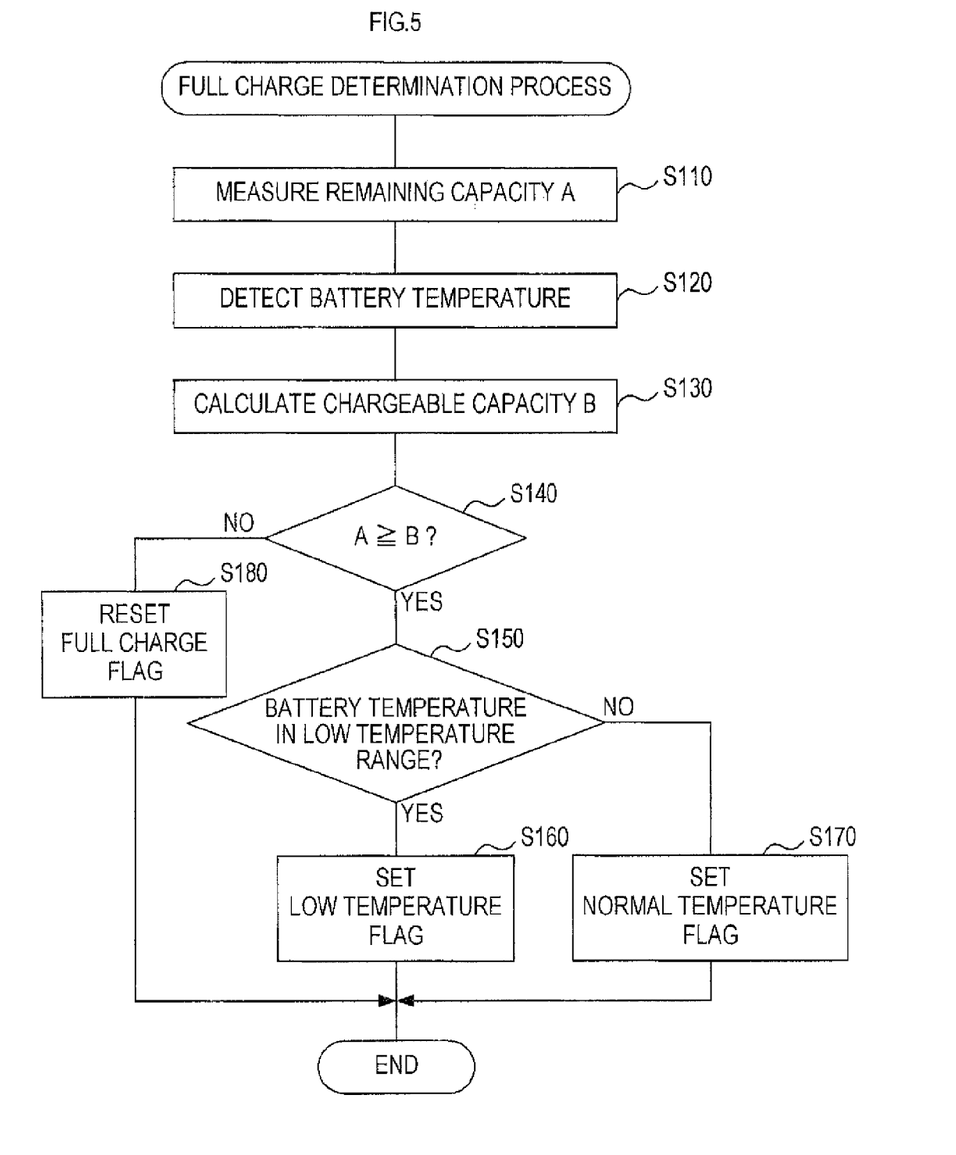
FIG. 5 is a flowchart of a full charge determination process in a first embodiment.

When starting the full charge determination process in FIG. 5, the CPU 31a measures a remaining capacity A of the cells in S110. Specifically, respective cell voltages of the cells constituting the battery 10 are obtained. Then, a highest cell voltage among the respective cell voltages is regarded as the remaining capacity A. To regard the highest cell voltage as the remaining capacity A is merely an example, and the remaining capacity A may be obtained by another calculation method, or the like.

In S120, the battery temperature is detected based on a detection signal from the thermistor 33. In S130, based on the battery temperature detected in S120, a maximum value of a capacity (a chargeable capacity B) chargeable at the detected battery temperature is calculated. In the present embodiment, the battery temperature is classified into two temperature ranges, for example, the normal temperature range and the low temperature range, and respective set values are set for the temperature ranges. Accordingly, in S130, the set value VH (for example, 4.1V) is calculated as the chargeable capacity B when the battery temperature is in the normal temperature range; the set value VL (for example, 3.6V) is calculated as the chargeable capacity B when the battery temperature is in the low temperature range.

The cell voltage generally varies depending on the charge amount (the remaining capacity), and the cell voltage is lower as the remaining capacity is lower. Accordingly, the cell voltage is treated as the charge amount for the sake of convenience in the present embodiment.

In S140, it is determined whether the remaining capacity A measured in S110 is equal to or more than the chargeable capacity B calculated in S130. If the remaining capacity A is equal to or more than the chargeable capacity B, the battery 10 is determined to be in the fully charged state, and the present process proceeds to S150.

In S150, it is determined whether the battery temperature detected in S120 is in the low temperature range. If the battery temperature is in the low temperature range, a low temperature flag is set in S160; if the battery temperature is in the normal temperature range, a normal temperature flag is set in S170.

If the remaining capacity A is lower than the chargeable capacity B in S140, the battery 10 is determined not to be in the fully charged state, and a fully charged flag (both the low temperature flag and the normal temperature flag) is reset in S180.

(4-2) Trigger Operation Determination Process

Next, a description of a trigger operation determination process will be given with reference to FIG. 6. When starting operation, the CPU 31a of the microcomputer 31 in the battery pack 1 reads a program for the trigger operation determination process in FIG. 6 from the memory 31b, and then periodically and repeatedly executes the program.

Figure 6:
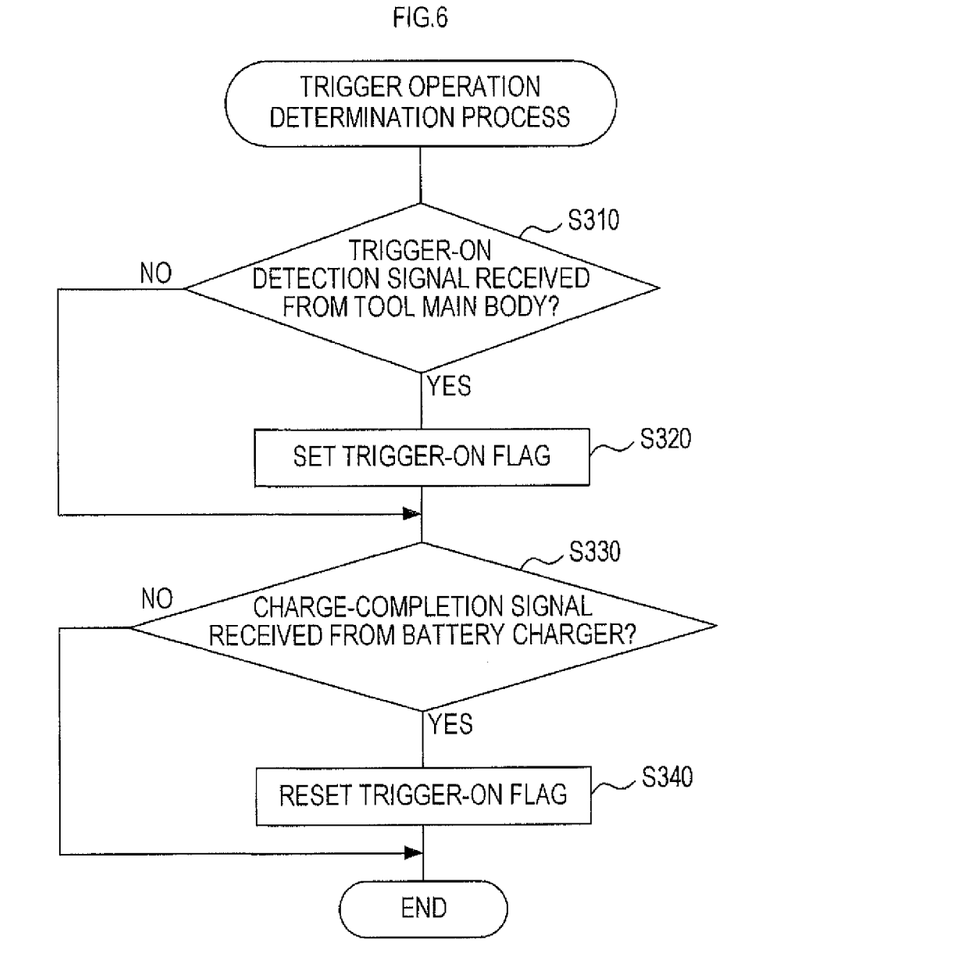
FIG. 6 is a flowchart of a trigger operation determination process in the first embodiment.

When starting the trigger operation determination process in FIG. 6, the CPU 31a determines in S310 whether a trigger-on signal is received from the tool main body 100. If a trigger-on signal is not received, the present process proceeds to S330. If a trigger-on signal is received, a trigger-on flag is set in S320, and then the present process proceeds to S330.

In S330, it is determined whether a charge-completion signal is received from the battery charger 120. If a charge-completion signal is not received, the present trigger operation determination process is terminated. If a charge-completion signal is received, the trigger-on flag is reset in S340.

For example, the trigger operation determination process in FIG. 6 is a process in which when the battery 10 has reached the fully charged state, the trigger-on flag is reset; and if the battery 10 is attached to the tool main body 100 after reaching the fully charged state and then the trigger switch 114 is turned on at least once (for example, discharge to the motor 112 is performed at least once), the trigger-on flag is set. Once the trigger-on flag is set, the trigger-on flag remains set until the battery 10 is charged to the fully charged state by the battery charger 120.

(4-3) Temperature Change Determination Process

Next, a description of a temperature change determination process will be given with reference to FIG. 7. When starting operation, the CPU 31a of the microcomputer 31 in the battery pack 1 reads a program for the temperature change determination process in FIG. 7 from the memory 31b, and then periodically and repeatedly executes the program.

Figure 7:
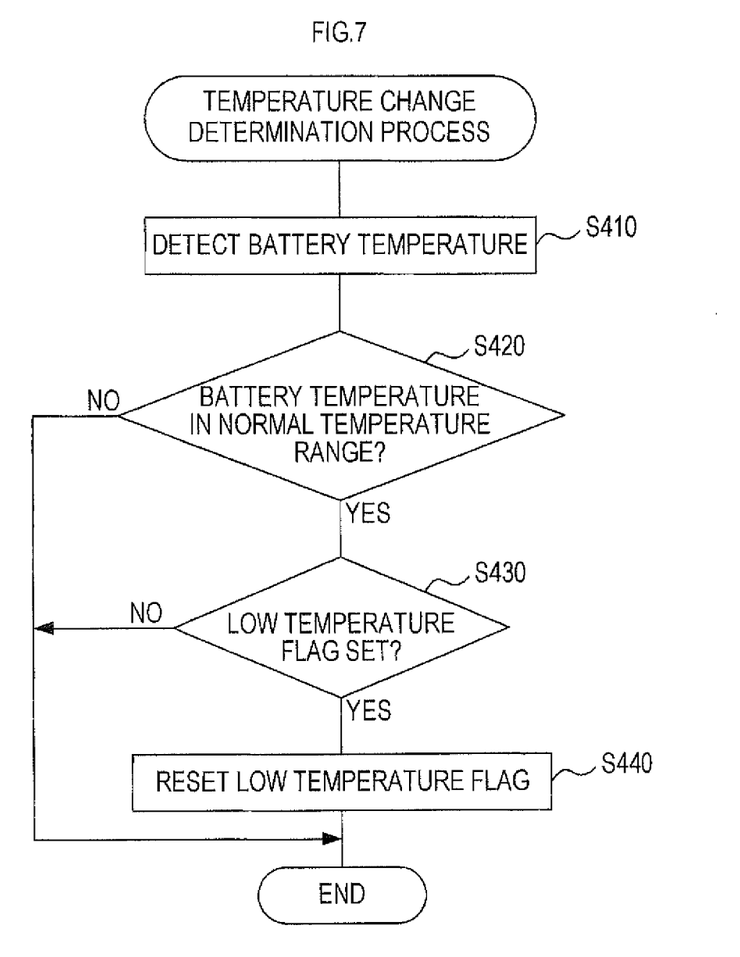
FIG. 7 is a flowchart of a temperature change determination process in the first embodiment.

When starting the temperature change determination process in FIG. 7, the CPU 31a detects a battery temperature in S410 based on a detection signal from the thermistor 33. In S420, it is determined whether the battery temperature detected in S410 is in the normal temperature range. If the battery temperature is not in the normal temperature range, the present temperature change determination process is terminated. If the battery temperature is in the normal temperature range, the present process proceeds to S430.

In S430, it is determined whether a low temperature flag is set. If the low temperature flag is not set, the present temperature change determination process is terminated. If the low temperature flag is set, the low temperature flag is reset in S440.

The fact that the low temperature flag is set means that charging was performed at a low temperature until reaching the set value VL. The fact that the battery temperature has thereafter risen to enter the normal temperature range means that the current remaining capacity is not in the fully charged state but in a further chargeable state with respect to the normal temperature range. Accordingly, if the fully charged state is reached at a low temperature, but the battery temperature thereafter rises to enter the normal temperature range, the low temperature flag is reset by the process in FIG. 7 (for example, a determination result that the battery 10 is in the fully charged state is cancelled).

(4-4) Notification Process

Next, a description of a notification process will be given with reference to FIG. 8. When starting operation, the CPU 31a of the microcomputer 31 in the battery pack 1 reads a program for the notification process in FIG. 8 from the memory 31b, and then periodically and repeatedly executes the program.

Figure 8:
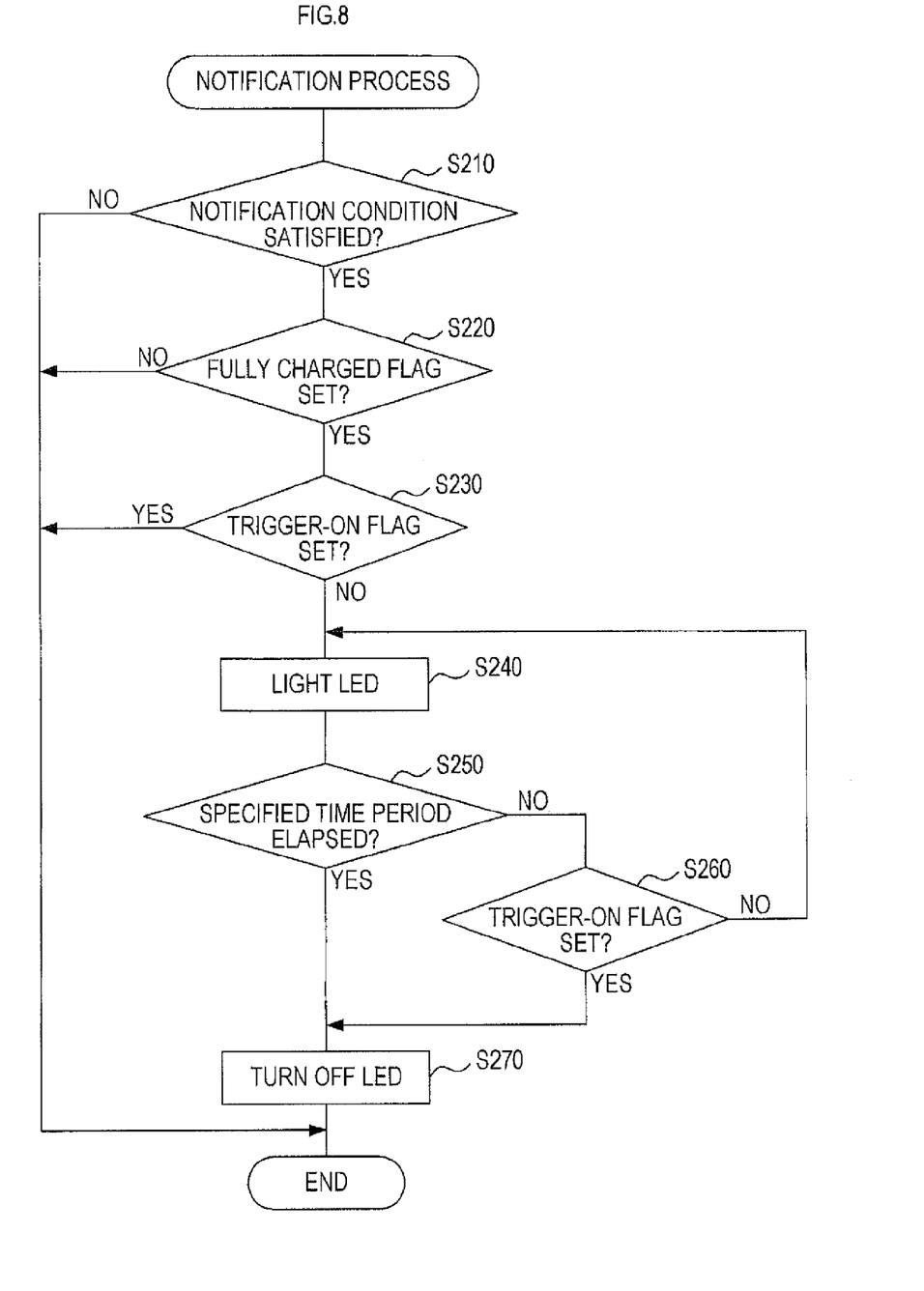
FIG. 8 is a flowchart of a notification process in the first embodiment.

When starting the notification process in FIG. 8, the CPU 31a determines in S210 whether a notification condition is satisfied. The notification condition specifically is, for example, the fact that oscillation of the battery pack 1 is detected by the oscillation sensor 34.

If the notification condition is not satisfied, for example, oscillation of the battery pack 1 is not detected, the present notification process is terminated. If the notification condition is satisfied, for example, oscillation of the battery pack 1 is detected, it is determined in S220 whether the fully charged flag is set, or whether, for example, either the low temperature flag or the normal temperature flag is set. If any fully charged flag is not set, the present notification process is terminated. If the fully charged flag is set, the present process proceeds to S230.

In S230, it is determined whether the trigger-on flag is set. If the trigger-on flag is set, the present notification process is terminated. If the trigger-on flag is not set, an LED 35 is lit in S240. In S250, it is determined whether a specified time period has elapsed since a start of lighting of the LED 35 in S240.

If the specified time period has not elapsed since the start of lighting, it is determined in S260 whether the trigger-on flag is set. If the trigger-on flag is not set, the present process returns to S240. If it is determined in S250 that the specified time period has elapsed since the start of lighting, or if it is determined in S260 that the trigger-on flag is set, the LED 35 is turned off in S270.

As described above, in a case where the notification condition is satisfied (for example, oscillation is detected), either of the fully charged flags is set, and the trigger-on flag is not set, the battery 10 is determined to be in the fully charged state, and the LED 35 is lit for the specified time period. Accordingly, a user of the battery pack 1 can recognize whether the battery 10 is in the fully charged state based on whether the LED 35 is lit when the user give an oscillation to the battery pack 1, for example, by taking up the battery pack 1 or attaching the battery pack 1 to the tool main body 100.

(5) Effects of First Embodiment

According to the battery pack 1 of the present embodiment described above, in a case where the remaining capacity A is equal to or more than the chargeable capacity B, the battery 10 is determined to be in the fully charged state. In a case where any factor to increase the chargeable capacity occurs thereafter, the fully charged state is cancelled (the fully charged flag is reset). A user can visually recognize whether the battery 10 is in the fully charged state based on lighting or extinction of the LED 35 when oscillating the battery pack 1.

Accordingly, the user can properly recognize the charge state of the battery 10 depending on its actual remaining capacity, such as whether the battery 10 is actually in the fully charged state. Particularly, in the present embodiment, since the charge state of the battery 10 can be visually recognized via the LED 35, the user can easily identify, even in a case where a plurality of battery packs are present, which of the plurality of battery packs is/are in the fully charged state.

Also, if the trigger switch 114 of the tool main body 100 is turned on after the battery 10 is determined to be in the fully charged state, the fully charged state is cancelled. Accordingly, a user can properly recognize a decrease in the charge amount resulting from the trigger switch 114 being turned on. A decrease in the charge amount resulting from discharge to the tool main body 100 may be detectable, for example, by detecting a discharge current. However, as compared with such method, detection of a decrease is easier by the detection method based on turning on of the trigger switch 114.

In a case where the battery 10 is determined to be in the fully charged state, and the battery temperature thereafter rises above that detected when such determination is made (specifically in a case where the temperature range is changed), the fully charged state is cancelled. Accordingly, a user can properly recognize a relative decrease in the charge amount due to temperature rise.

Further, in the present embodiment, determination of the charge state of the battery 10 is performed by the full charge determination process (FIG. 5) regardless of presence/absence of oscillation of the battery pack 1; and if the battery 10 is in a fully charged state, a fully charged flag indicating the fully charged state is set. Then, if an oscillation of the battery pack 1 is detected while the fully charged flag is set, the LED 35 is lit. Accordingly, a user can properly recognize, if necessary, the charge state depending on the actual remaining capacity by oscillating the battery pack 1.

If a user wants to confirm whether the battery 10 is in the fully charged state by means of the LED 35, the user simply needs to oscillate the battery pack 1. For example, the user can confirm whether the battery 10 is in the fully charged state, for example, simply by moving the battery pack 1 or shaking the battery pack 1 by hand. Accordingly, the battery pack 1 with high convenience can be provided.

A configuration may be possible in which, for example, whether the battery 10 is in the fully charged state can be confirmed by an external operation (for example, an operation of a switch) of the battery pack 1. However, such configuration may affect the waterproof performance and dustproof performance of the battery pack 1. Therefore, in view of the waterproof performance and dustproof performance of the battery pack 1, it is preferable to install the oscillation sensor 34 in the battery pack 1 to thereby detect presence/absence of oscillation based on a detection signal from the oscillation sensor 34 (and thus to perform lighting control of the LED 35).

Second Embodiment

In the above described first embodiment, the microcomputer 31 in the battery pack 1 is configured to periodically and repeatedly execute the full charge determination process in FIG. 5 regardless of whether the notification condition is satisfied. In contrast, in a second embodiment, the microcomputer 31 performs the full charge determination and lighting control of the LED 35 based on the result of the full charge determination when the notification condition is satisfied.

Figure 9:
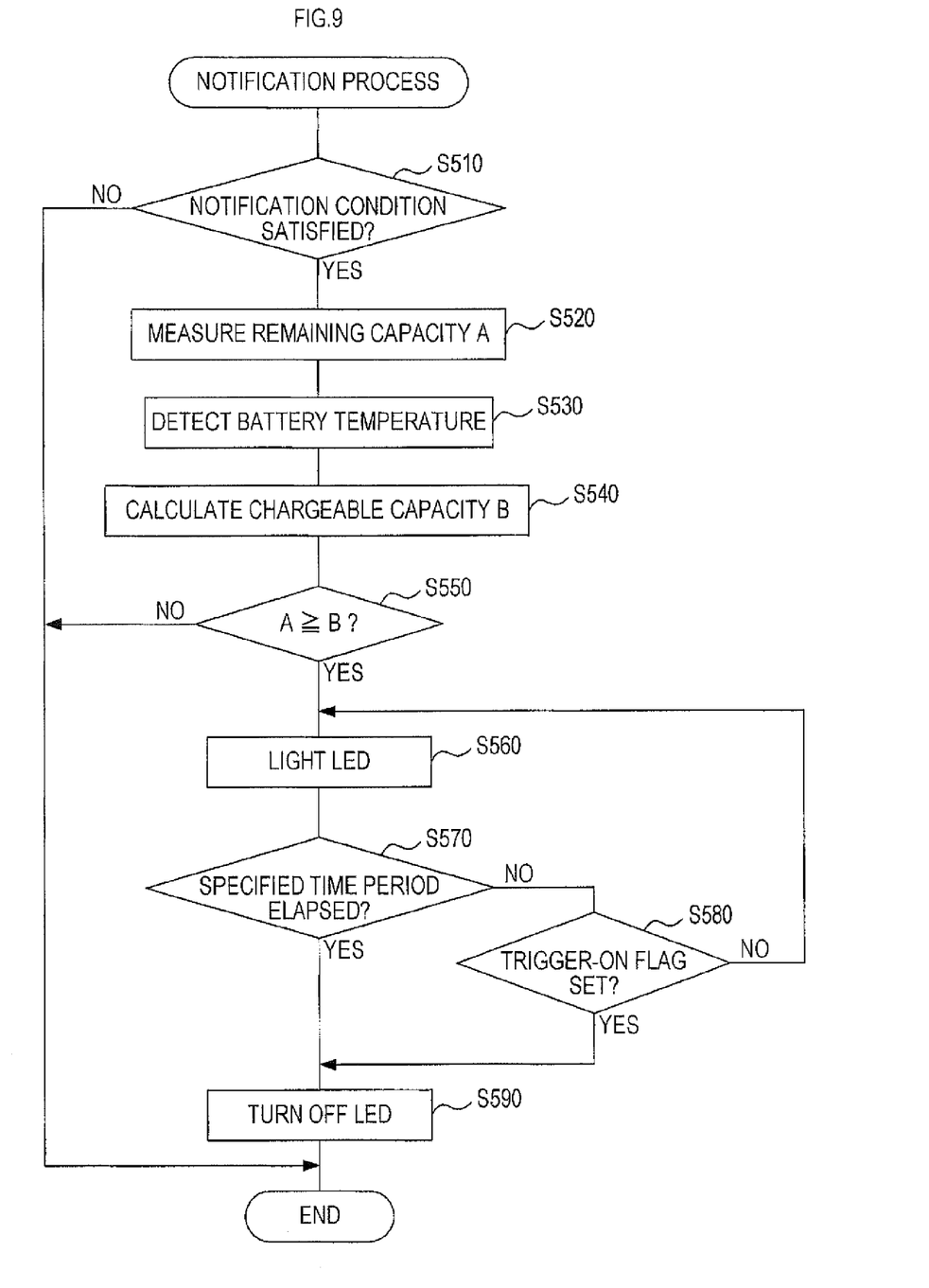
FIG. 9 is a flowchart of a notification process in a second embodiment.

For example, in the second embodiment, the microcomputer 31 in the battery pack 1 executes the trigger operation determination process in FIG. 6, and also executes a notification process in FIG. 9 in place of the processes in FIG. 5, FIG. 7, and FIG. 6.

When starting operation, the CPU 31a of the microcomputer 31 in the battery pack 1 reads a program for the notification process in FIG. 9 from the memory 31b, and then periodically and repeatedly executes the program (the notification process).

When starting the notification process in FIG. 9, the CPU 31a determines in S510 whether the notification condition is satisfied. This determination is the same as in S210 in FIG. 8. If the notification condition is not satisfied, the present notification process is terminated; if the notification condition is satisfied, the present process proceeds to S520.

Processes in S520 to S550 are the same as the processes in S110 to S140 in FIG. 5. For example, the remaining capacity A of the cell is measured in S520, the battery temperature is detected in S530, and the chargeable capacity B is calculated in S540. Then in S550, it is determined whether the remaining capacity A measured in S520 is equal to or more than the chargeable capacity B calculated in S540.

If the remaining capacity A is equal to or more than the chargeable capacity B, it is determined that the battery 10 is in the fully charged state, and the present process proceeds to S560. Processes in S560 to S590 are the same as the processes in S240 to S270 in FIG. 8. For example, the LED 35 is lit in S560, and it is determined in S570 whether a specified time period has elapsed since the start of lighting. If the specified time period has not elapsed, it is determined in S580 whether the trigger-on flag is set; and if the trigger-on flag is not set, the present process returns to S560. If the specified time period has elapsed since the start of lighting, or if it is determined in S580 that the trigger-on flag is set, the LED 35 is turned off in S590. If it is determined in S550 that the remaining capacity A is lower than the chargeable capacity B, it is determined that the battery 10 is not in the fully charged state, and the present notification process is terminated.

In the second embodiment as described above, when the notification condition is satisfied, such as when an external oscillation is applied to the battery pack 1 by a user or the like, the determination of whether the battery 10 is in the fully charged state and the lighting control of the LED 35 based on the result of the determination are performed. Accordingly, a user can properly recognize, if necessary, the charge state depending on the actual remaining capacity, for example, by moving the battery pack 1.

Other Embodiments

Although the notification condition is the fact that an oscillation of the battery pack 1 is detected by the oscillation sensor 34 in the above embodiments, this is merely an example of the notification condition. A notification condition different from a detection of an oscillation may be set, or various notification conditions may be set in addition to a detection of an oscillation. In a case of setting a plurality of conditions, satisfaction of the notification condition may be defined as satisfaction of at least one or more of the plurality of conditions, or may be defined as satisfaction of all of the plurality of conditions.

Another example of the notification condition may be, for example, a detection of attachment of the battery pack 1 to the tool main body or to the battery charger. In case of the detection of attachment, an attachment may be directly detected by means of for example, data communication with an attachment target or any other method, instead of using the detection of an oscillation by the oscillation sensor 34. For example, it may be configured such that the microcomputer 31 in the battery pack 1 and the microcomputer 111 in the tool main body 100 perform data communication. Also, it may be configured such that the microcomputer 31 in the battery pack 1 and the microcomputer 131 in the battery charger 120 perform data communication.

Further, it may be configured such that the battery pack 1 is provided with an operation switch, and it is determined that the notification condition is satisfied when the operation switch is operated by a user. With such configuration, a user can easily confirm the charge state of the battery pack 1 at any desired time by operating the operation switch.

In the case of using a detection of an oscillation of the battery pack 1 as the notification condition, it is not necessarily required to use the oscillation sensor 34, but it may be configured such that oscillation of the battery pack 1 is directly or indirectly detected using a sensor other than the oscillation sensor 34 (such as, an acceleration sensor, a gyro sensor, or the like).

(2) In the first embodiment, the battery temperature is detected in S120 of the full charge determination process in FIG. 5, and then the full charge determination (setting or resetting of the fully charged flag) depending on the battery temperature is performed. Accordingly, the temperature change determination process in FIG. 7 may be omitted depending on an execution cycle of the full charge determination process in FIG. 5. For example, in a case where the full charge determination process in FIG. 5 and the temperature change determination process in FIG. 7 are to be executed at the same cycle, it is not necessary to separately execute the temperature change determination process in FIG. 7. Alternatively, the temperature change determination process in FIG. 7 may be executed independent of the full charge determination process in FIG. 5 regardless of the execution cycle thereof.

(3) The time period (the specified time period) of lighting the LED 35 may be optionally set by a user or the like. In this case, for example, a setting device may be provided in the battery pack 1 itself to allow setting, or wired or wireless communication between the battery pack 1 and an external device may be used to allow setting from the external device.

(4) In the above embodiments, either of the two types of values is calculated depending on the battery temperature as the chargeable capacity B. However, it may be configured such that three or more types of temperature ranges of the battery temperature are defined and a chargeable capacity B is calculated for each of the temperature ranges. Then, it may be configured such that, in a case where the fully charged state is determined based on the chargeable capacity B corresponding to a certain battery temperature, and thereafter the battery temperature rises to enter a different temperature range, the fully charged state is cancelled (for example, the fully charged flag is reset).

Also, it may be configured such that the chargeable capacity B can be set by an external device other than the battery pack 1 via wired or wireless communication. In this case, the external device may set the chargeable capacity B based on an ambient temperature. Alternatively, the external device may obtain the battery temperature from the battery pack 1 via communication and set the chargeable capacity B based on the obtained battery temperature.

(5) In the above embodiments, it is configured such that when any one of the cell voltages of the plurality of cells constituting the battery 10 is in a fully charged state, both the microcomputer 31 in the battery pack 1 and the microcomputer 131 in the battery charger 120 determine that the battery 10 as a whole is in the fully charged state. However, such full charge determination process is merely an example. In the above embodiments, a comparison target is the remaining capacity of a cell having the highest remaining capacity (for example, having the highest cell voltage) among the plurality of cells constituting the battery 10; and if the remaining capacity of the cell is lower than the chargeable capacity B, the battery 10 as a whole is determined not to be in the fully charged state. However, such process for determination of a non-fully charged state is also merely an example. For example, it may be configured such that it is determined whether the battery 10 is fully charged based on the voltage (the battery voltage) of the battery 10 as a whole.

(6) It is not necessarily required to use the LED 35 as a specific device to notify a user or the like of whether the battery 10 is in the fully charged state. Any device other than the LED 35 (for example, indication on a liquid crystal display, notification by sound, etc.) may be used to make such notification.

In addition to the device to notify a user or the like of whether the battery 10 is in the fully charged state, a common indication device to indicate the remaining capacity of the battery 10 may be provided at a given region of the battery pack 1 (for example, in a vicinity of the device to notify whether the battery 10 is in the fully charged state).

(7) In the above embodiments, the description is given of an example of making a determination on the fully charged state and controlling the lighting of the LED 35 depending on the result of the determination. However, it may be configured such that a determination is made as to a different type of state other than the fully charged state, and the lighting of the LED 35 is controlled depending on the result of the determination as to the different type of state. For example, a voltage in a state that is not equal, but close, to the fully charged state (for example, a voltage slightly lower than the cell voltage in the fully charged state) may be set to make a determination and perform the lighting control of the LED 35 based on the set voltage.

(8) In the above embodiments, the communication terminal 23 for data communication with the tool main body 100 and the communication terminal 24 for data communication with the battery charger 120 are separately provided. However, these communication terminals may be configured as a single terminal.

(9) In the above embodiments, the discharge terminal 21 for discharging and the charge terminal 41 for charging are separately provided as the cathode terminal for external connection to be connected to the cathode of the battery 10. However, these terminals may be configured as a single cathode terminal. Also in such case, an SCP including a fuse, which is designed not to be melted down by the discharge current or the charge current in normal operation, may be provided between the single cathode terminal and the cathode of the battery 10.

(10) Indication of whether the fully charged state is reached using a notification device, such as the LED 35, requires power consumption. Therefore, in view of the power consumption for the indication, it may be configured such that it is determined that the fully charged state is cancelled, and no indication on the fully charged state is made after such indication has been made a specified number of times or more.

(11) The battery pack 1 is also attachable to various motor-driven appliances other than the tool main body 100 shown in FIG. 1, and is capable of supplying power for operation to the various motor-driven appliances. Further, the battery pack 1 is attachable to various battery chargers other than the battery charger 120 shown in FIG. 2 to charge the battery 10.

What is claimed is:

1. A battery pack, comprising:
   a battery comprising a secondary battery;
   a temperature detection unit configured to detect a temperature of the battery;
   a notification unit configured to notify that the battery is in a fully charged state;
   a determination unit configured to determine whether the battery is in the fully charged state;
   a processing unit configured to execute a full charge process if it is determined by the determination unit that the battery is in the fully charged state, the full charge process being one of causing the notification unit to make a notification and maintaining a possible state, in which making a notification by the notification unit is possible; and
   a factor detection unit configured to detect, as an increase factor that leads to an increase in a chargeable capacity of the battery, that a current temperature of the batter detected by the temperature detection unit has risen from a temperature at the time when it is determined by the determination unit that the battery is in the fully charged state,
   wherein the processing unit stops the full charge process if occurrence of the at least one predetermined increase factor is detected by the factor detection unit during the execution of the full charge process.

2. The battery pack according to claim 1, further comprising:
   a request detection unit configured to detect a predetermined notification request to cause the notification unit to make a notification,
   wherein the processing unit executes the full charge process of maintaining the possible state, and also causes the notification unit to make a notification if the notification request is detected by the request detection unit during the execution of the full charge process.

3. The battery pack according to claim 1, further comprising:
   a request detection unit configured to detect a predetermined notification request to cause the notification unit to make a notification,
   wherein the determination unit determines whether the battery is in the fully charged state if the notification request is detected by the request detection unit, and
   wherein the processing unit executes the full charge process of causing the notification unit to make a notification.

4. The battery pack according to claim 2,
   wherein the request detection unit includes a behavior detection unit configured to detect a behavior of the battery pack, and detects, if a predetermined behavior is detected by the behavior detection unit, the behavior as the notification request.

5. The battery pack according to claim 1,
   wherein the factor detection unit detects occurrence of the increase factor when the temperature of the battery has risen from a predetermined low temperature range to a normal temperature range higher than the low temperature range.

6. The battery pack according to claim 1,
   wherein three or more types of temperature ranges of the temperature of the battery are defined, and
   wherein the factor detection unit detects occurrence of the increase factor when the temperature of the battery has risen thereby to change a temperature range in which the temperature is included.

7. The battery pack according to claim 1,
   wherein the battery comprises a plurality of cells, and
   wherein the determination unit determines whether the battery is in the fully charged state on the basis of a highest cell voltage among cell voltages of the plurality of cells.

8. The battery pack according to claim 1,
   wherein, after determining that the battery is in the fully charged state, the determination unit cancels a determination that the battery is in the fully charged state when the increase factor is detected by the factor detection unit.

9. The battery pack according to claim 8,
   wherein, after determining that the battery is in the fully charged state, the determination unit resets a flag showing that the battery is in the fully charged state when the increase factor is detected by the factor detection unit.

* * * * *